(12) United States Patent
Dittus et al.

(10) Patent No.: US 7,599,183 B2
(45) Date of Patent: Oct. 6, 2009

(54) VARIABLE POSITION DAMPERS FOR CONTROLLING AIR FLOW TO MULTIPLE MODULES IN A COMMON CHASSIS

(75) Inventors: Karl Klaus Dittus, Durham, NC (US); Michael Sven Miller, Raleigh, NC (US); Whitcomb Randolph Scott, III, Chapel Hill, NC (US); Joel Edwin Walker, Raleigh, NC (US)

(73) Assignee: International Business Machines Corporation, Armonk, NY (US)

( * ) Notice: Subject to any disclaimer, the term of this patent is extended or adjusted under 35 U.S.C. 154(b) by 30 days.

(21) Appl. No.: 12/038,246

(22) Filed: Feb. 27, 2008

(65) Prior Publication Data
US 2009/0213544 A1 Aug. 27, 2009

(51) Int. Cl.
*H05K 7/20* (2006.01)
(52) U.S. Cl. ............... 361/695; 361/715; 361/716; 361/727; 361/728; 361/729; 454/184
(58) Field of Classification Search .............. None
See application file for complete search history.

(56) References Cited

U.S. PATENT DOCUMENTS

| | | | | |
|---|---|---|---|---|
| 5,414,591 A | * | 5/1995 | Kimura et al. | 361/695 |
| 5,528,455 A | * | 6/1996 | Miles | 361/695 |
| 5,963,528 A | * | 10/1999 | Fujimura et al. | 720/655 |
| 6,047,836 A | * | 4/2000 | Miles | 211/41.17 |
| 6,181,557 B1 | | 1/2001 | Gatti | |
| 6,542,363 B2 | * | 4/2003 | White | 361/695 |
| 6,579,168 B1 | * | 6/2003 | Webster et al. | 454/184 |
| 6,771,499 B2 | | 8/2004 | Crippen et al. | |
| 7,238,104 B1 | | 7/2007 | Greenslade et al. | |
| 7,247,089 B2 | * | 7/2007 | Crippen et al. | 454/184 |
| 7,310,737 B2 | * | 12/2007 | Patel et al. | 713/300 |
| 7,316,606 B2 | * | 1/2008 | Shipley et al. | 454/184 |
| 2005/0276017 A1 | | 12/2005 | Aziz et al. | |
| 2006/0133036 A1 | | 6/2006 | Durney | |

OTHER PUBLICATIONS

Author Unknown, Dynamic Flow Distribution Control, 1 page.

* cited by examiner

*Primary Examiner*—Boris L Chervinsky
(74) *Attorney, Agent, or Firm*—Cynthia G. Seal; Jeffrey L. Streets

(57) ABSTRACT

An apparatus comprising a chassis providing a plurality of module bays, one or more modules received in the module bays, wherein each module has at least one damper actuator extending from a distal end of the module. A fan assembly and a plurality of air flow dampers are secured in a distal end of the chassis, wherein each damper is aligned with one module bay to control air flow through the aligned module bay. Each damper is biased to close in the absence of contact with a damper actuator and opens in response to contact with a damper actuator. Each damper opens to a variable extent determined by the profile of the contacting damper actuator. The damper actuator of a particular module has a profile corresponding to the thermal load of that module, such that installing a module into the chassis automatically opens the aligned damper to the desired extent.

14 Claims, 7 Drawing Sheets

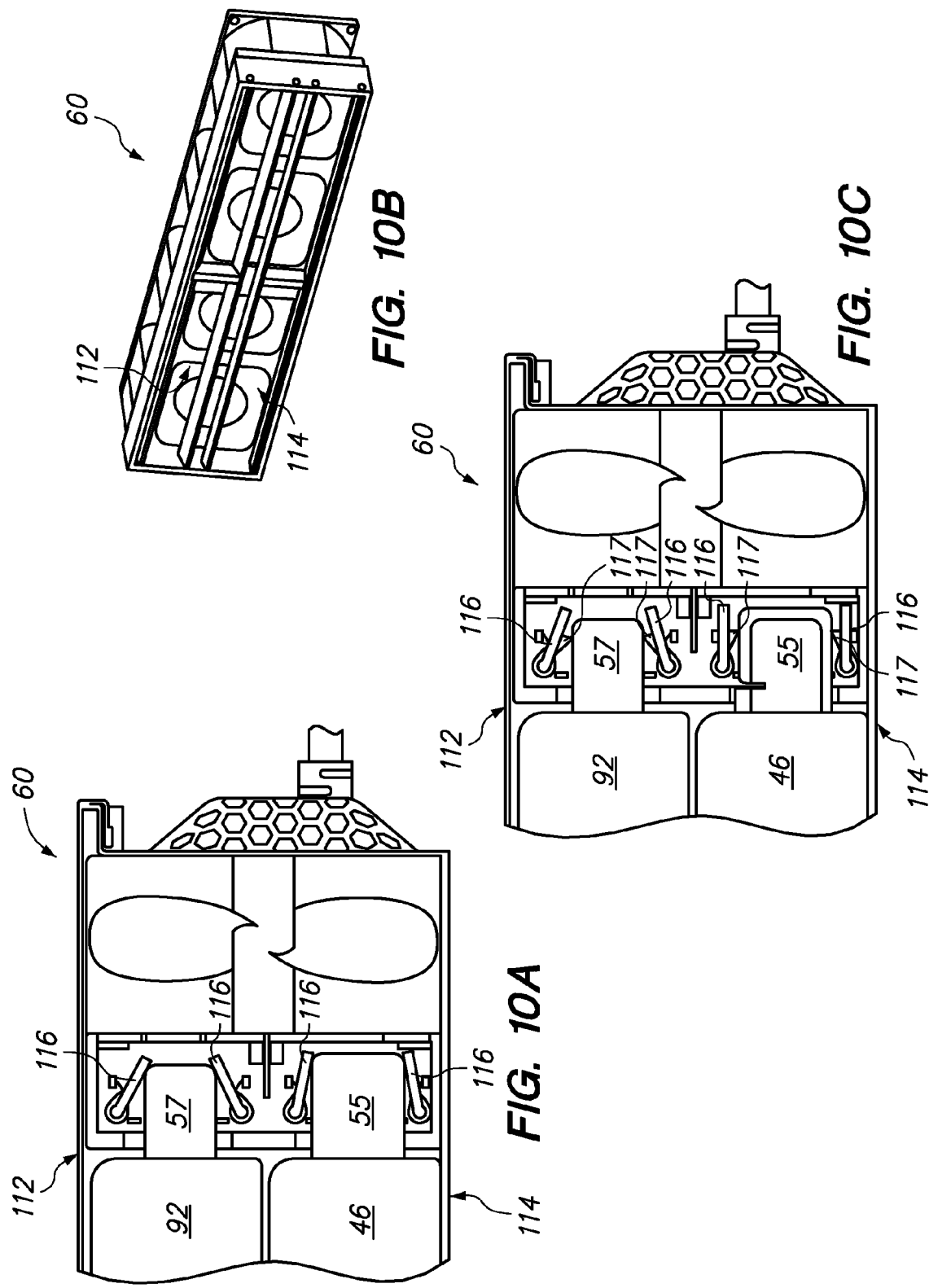

US 7,599,183 B2

VARIABLE POSITION DAMPERS FOR CONTROLLING AIR FLOW TO MULTIPLE MODULES IN A COMMON CHASSIS

BACKGROUND OF THE INVENTION

1. Field of the Invention

The present invention relates to air flow through computer chassis that contain multiple modules.

2. Description of the Related Art

In flexible computer systems, system nodes or modules, such as blade servers, are frequently installed and removed from a chassis. When a module is removed from the chassis, an air flow short circuit is created and the air flow of adjacent modules is reduced. Frequently, the module being removed must be replaced with a substitute module or plate to prevent the redirection of airflow through the vacant bay.

In order to provide an adequate flow rate of cooling air through each individual module, one known system provides each module with its own fan assembly. A controller may then control the speed of the fan assembly in order to control the temperature of components within the module.

Another known system provides a common fan assembly for a plurality of modules, such as blade servers. However, in order to avoid high temperatures in any of the modules, it is generally necessary to provide each module with the same high flow rate. As a result, some modules receive an excessive flow rate of cooling air.

Accordingly, there remains a need for an effective system for preventing air short circuits, avoiding high temperatures within each of the modules, and efficiently using air flow without over cooling. It would be desirable for the system to redirect air flow from one module to another as needed. It would also be desirable for the system to balance the air flow between multiple modules sharing a common fan. Beneficially, the system would further direct more air flow to high powered modules and less air flow to lower powered modules.

SUMMARY OF THE INVENTION

One embodiment of the invention provides an apparatus comprising a chassis having a proximal end that provides access to a plurality of module bays. One or more modules are each received in one of the module bays, wherein each module has at least one damper actuator distally extending from a distal end of the module. A fan assembly including a plurality of fans is secured in a distal end of the chassis. Between the module bays and the fan assembly is a plurality of air flow dampers, wherein each air flow damper is aligned with one module bay to control air flow through the aligned module bay. Each damper closes in the absence of contact with one of the damper actuators and opens in response to contact with at least one of the damper actuators. When a damper is contacted by a damper actuator as a result of one of the modules being received in one of the module bays, then the damper opens to a variable extent determined by the profile of the damper actuator that is contacting the damper.

In another embodiment, the one or more modules includes first and second modules, wherein the first module has a damper actuator having a first profile aligned with a first damper and the second module has a damper actuator having a second profile aligned with a second damper. Optionally, the first module may have a thermal load that is greater than a thermal load of the second module, and the first damper actuator profile opens the first damper to a greater extent than the second damper actuator profile opens the second damper. Preferably, the air flow caused by the fan assembly is distributed between the first and second modules in proportion to the extent that the first and second dampers are open.

Other embodiments, aspects, and advantages of the invention will be apparent from the following description and the appended claims.

BRIEF DESCRIPTION OF THE DRAWINGS

FIGS. 10A and 10B provide a cross-sectional side view and a perspective view of the fan assembly of FIG. 7, with the upper and lower air flow dampers open.

FIG. 10C provides a cross-sectional side view of the fan assembly of FIG. 10A, wherein each of the individual damper blades include a ramp for contacting the damper actuator.

DETAILED DESCRIPTION OF PREFERRED EMBODIMENTS

Figure 1:
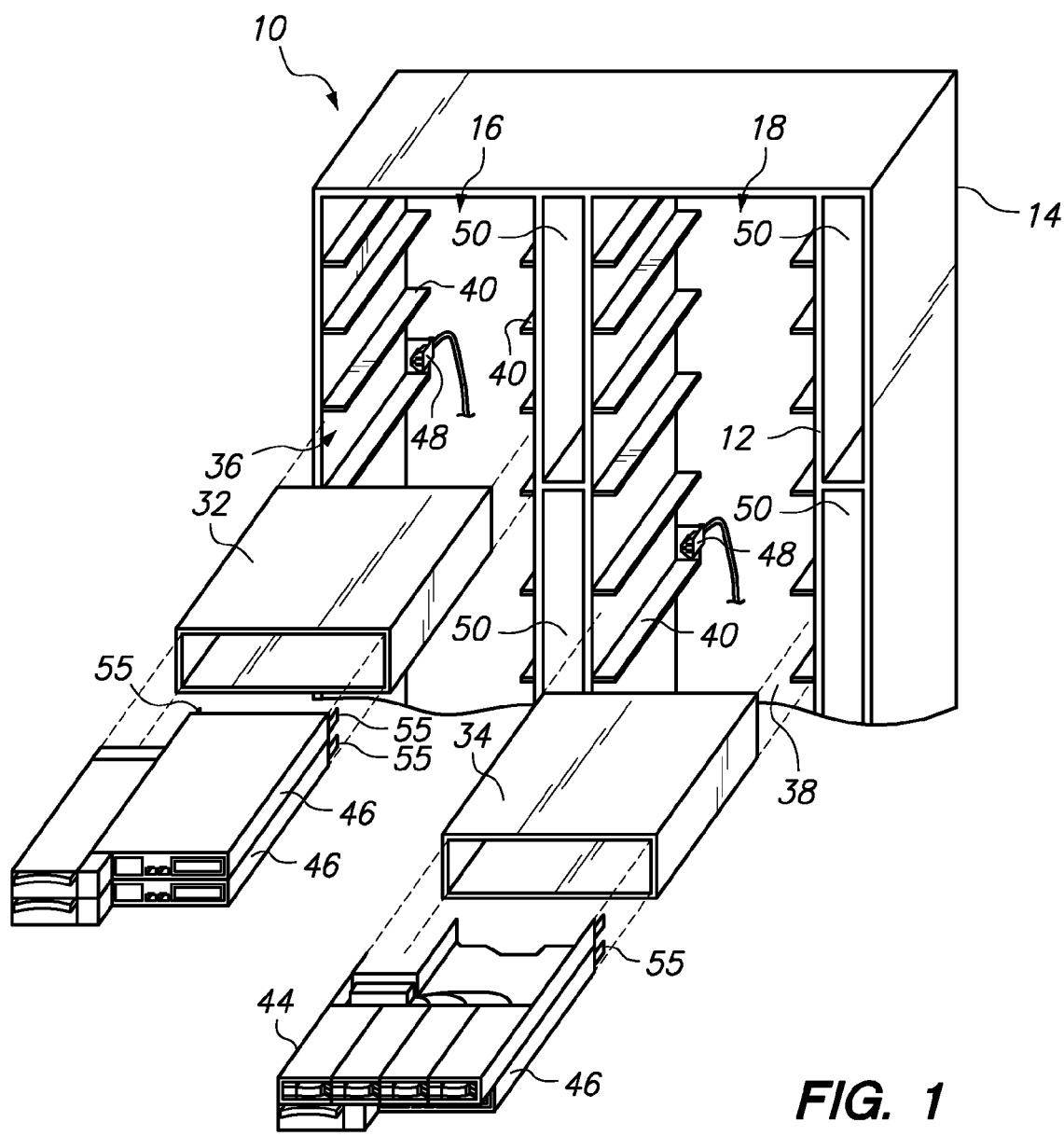
FIG. 1 is a perspective view of a rack receiving a pair of chassis, wherein each chassis is receiving two modules.

One embodiment of the invention provides an apparatus comprising a chassis having a proximal end that provides access to a plurality of module bays. One or more modules are each received in one of the module bays, wherein each module has at least one damper actuator distally extending from a distal end of the module. A fan assembly including a plurality of fans is secured in a distal end of the chassis. Between the module bays and the fan assembly is a plurality of air flow dampers, wherein each air flow damper is aligned with one module bay to control air flow through the aligned module bay. Each damper closes in the absence of contact with one of the damper actuators and opens in response to contact with at least one of the damper actuators. When a damper is contacted by a damper actuator as a result of one of the modules being received in one of the module bays, then the damper opens to a variable extent determined by the profile of the damper actuator that is contacting the damper.

In another embodiment, the one or more modules of the apparatus includes first and second modules, wherein the first module has a damper actuator having a first profile aligned with a first damper and the second module has a damper actuator having a second profile aligned with a second damper. Optionally, the first module may have a thermal load that is greater than a thermal load of the second module, and the first damper actuator profile opens the first damper to a greater extent than the second damper actuator profile opens the second damper. Preferably, the air flow caused by the fan assembly is distributed between the first and second modules in proportion to the extent that the first and second dampers are open.

The fan assembly preferably includes a plurality of fans directed to draw air flow through the modules that have been received in the chassis and exhaust the air out the back (distal end) of the chassis. In a 2U chassis, each fan preferably has a housing that spans the width of both modules. Accordingly, the plurality of fans is arranged across the longer dimension of the chassis' back end.

In a further embodiment, the dampers are pivotally secured to a frame around the dampers. Such a frame is suitably about the same dimensions as the fan assembly intake. Accordingly, substantially all of the air flow induced by the fans is directly through the dampers. The air flow dampers are preferably biased toward a closed position, so that the dampers immediately close upon removal of a module from a module bay. In an exemplary configuration, each air flow damper may include a pair of damper blades that pivot apart upon inserting a damper actuator there between. Optionally, each damper blade may include a ramp positioned for contact with one of the damper actuators, such that the blades are opened even wider to allow greater air flow there through.

The damper actuators are constructed with a profile that, in cooperation with a known damper configuration, determines the extent to which the dampers will be opened. Accordingly, a module with a high thermal load will be constructed with a damper actuator that opens the dampers to a greater extent than will the damper actuators of a module with a low thermal load. For example, a compute module having a motherboard would be expected to produce a high thermal load and an expansion module having a set of disk drives would be expected to produce a low thermal load. In one embodiment, each module has two damper actuators spaced apart at the distal end of the module. The damper actuators for each module should be fixedly spaced relative to the module bay, so that inserting a module into the module bay will inherently align the damper actuator(s) of that module with the desired point on the dampers.

In other embodiments of the invention, the apparatus includes a protective grill disposed between the air flow dampers and the plurality of bays. The protective grill allows the passage of air without restriction, but prevents accidental contact of objects or fingers with the operating fans. Optionally, the protective grill may include passages to allow the damper actuators to engage the dampers. In a preferred embodiment, the protective grill is secured directly to the frame. Still further, the fan assembly, air flow dampers and protective grill may be secured together in a unitary fan pack.

A chassis may include any number of module bays, but the chassis preferably has two, three or four module bays. Optionally, the rack may receive a plurality of chassis with a different number of module bays, such as a rack receiving at least one chassis with two module bays (a 2U chassis) and at least one chassis with three module bays (a 3U chassis). The size of the chassis bays may be selectively configurable to receive any of the available chassis, such as by adjusting the elevation of a horizontal rail secured to a pair of vertical supports on either side of the chassis bays. The horizontal rails preferably run from front to back and provide support and alignment of the chassis into the rack.

In a further embodiment, the size of the chassis is selected on the basis of the number and type of modules that will be installed within the chassis. For example, a 2U chassis may include either two compute modules or one compute module and one expansion module. However, it is preferable that any chassis include at least one compute module and that the components in any expansion module will interface directly with a compute module within the same chassis, such as through an interface to a system bus or peripheral bus. These interconnections between modules are preferably made prior to installing the modules into a chassis. Each compute module should have an input/output panel on the front side of the module, wherein the input/output panel includes at least one input/output port for receiving a network cable.

FIG. 1 is a perspective view of a rack 10 receiving a first chassis 32 into a chassis bay 36 in the left hand column 16 of the rack 10 and a second chassis 34 into a chassis bay 38 in the right hand column 18 of the rack 10. The two chassis 32, 34 are received and supported on horizontal rails 40 that are spaced to accommodate the 2U chassis 32 and the 2U chassis 34. The vertical spacing between rails 40 is preferably adjustable to accommodate any combination of chassis having the same or different size.

Furthermore, the first 2U chassis 32 is receiving two 1U compute modules 46 and the second 2U chassis 34 is receiving a 1U compute module 46 and a 1U expansion module 44 including a bank of four disk drives. The 2U chassis 32 receives the two compute modules 46 independent of the other.

To the right of each column 16, 18 there are a plurality of network switch bays 50 that are suitable to receive a plurality of network switches (not shown). Having the network switch bays 50 located along the edge of the chassis bays 36, 38 facilitates network cable connections between compute modules and a network switch that are short, avoid interfering with access to adjacent modules, and allow the connections to be made from the front side 12 of the rack.

Furthermore, the lower left side rail 40 of each chassis bay 36, 38 secures an AC power cord connector 48 arranged in order to blind dock with a chassis power supply. As shown, the cord connector 48 is aligned with a mating connector on the power supply (See power supply 52 in FIG. 2) so that complete insertion of the chassis 32, 34 into the respective chassis bay 36, 38 completes the connection and supplies power to the respective power supply. No access from the back of the rack 10 is necessary to complete this connection. Furthermore, the damper actuators 55 extending distally from the distal end of each module 46, 44 may be considered to blind dock with the air flow dampers (not shown) that control air flow through the respective modules 46, 44.

Figure 2:
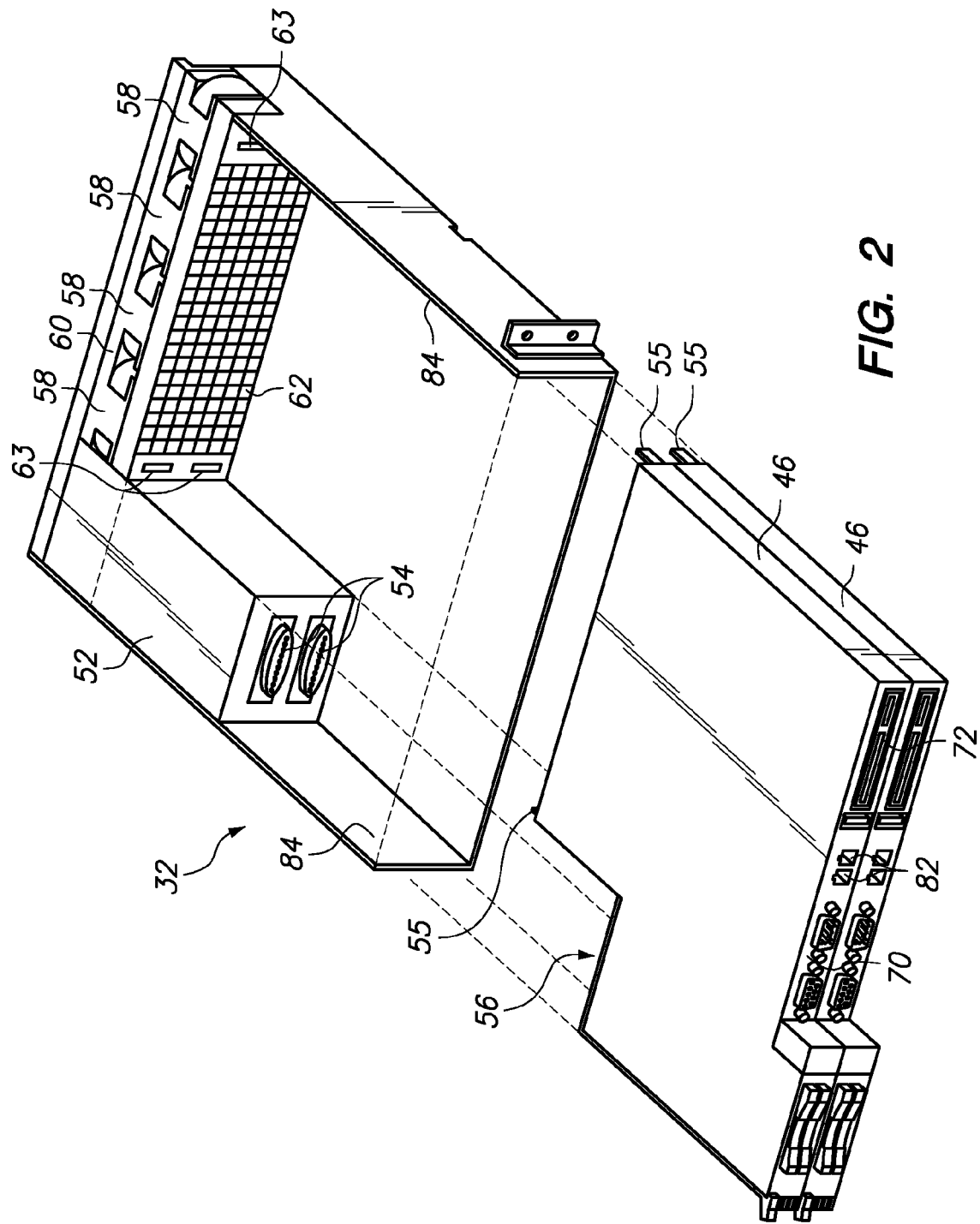
FIG. 2 is a perspective view of a chassis receiving two compute modules.

FIG. 2 is a perspective view of the first chassis 32 receiving the two compute modules 46. The 2U chassis 32 includes a power supply 52 having two front-facing connectors 54 for direct blind docking with mating connectors 56 (See FIG. 3A) on the compute modules 46. The 2U chassis 32 also includes an assembly or pack 60 of four fans 58 secured along the back of the chassis 32. The fan assembly 60 is shown with an air intake grill 62. Although the number of fans may vary, the 2U chassis 32 can accommodate larger diameter fans than a 1U module. Accordingly, the chassis 32 provides fewer, but larger fans that provide an air flow that is suitable to cool the module components while making more efficient use of electricity. Optionally, a 3U chassis might have only three or four fans of an even greater diameter.

The two compute modules 46 are preferably independently aligned and inserted into the chassis 32. Optionally, a single compute module may be installed or two compute modules may be installed separately as needed. In the embodiment shown, each individual compute module 46 includes an input/output panel 70 and a PCI slot 72. Furthermore, the input/ output panel 70 includes standard network connectors, such as Ethernet connectors 82, which can be used to connect the compute module to a network switch (not shown) using an Ethernet cable. For purposes of this disclosure it is assumed that each compute module is similarly equipped although the number and types of components may vary.

Upon insertion into the chassis 32, the compute modules 46 are guided rearward along the side walls 84 of the chassis 32 until a rearward facing power connector 56 on each the two compute modules 46 has blind docked with one of the two front-facing connectors 54 on the power supply 52. The vertical spacing of the front-facing connectors 54 and the rearward-facing connector 56 is the same to facilitate their connection. Accordingly, the components within each compute module are supplied with power. Preferably, the fan assembly 60 is directly powered and controlled by the power supply 52 which gets thermal sensor data from sensors within the chassis and/or from the compute module itself. The distal end of each module 46 also includes a pair of damper actuators 55 extending distally in alignment with slots 63 formed in the protective grill 62. The operation of the damper actuators is discussed in greater detail below.

Figure 3A:
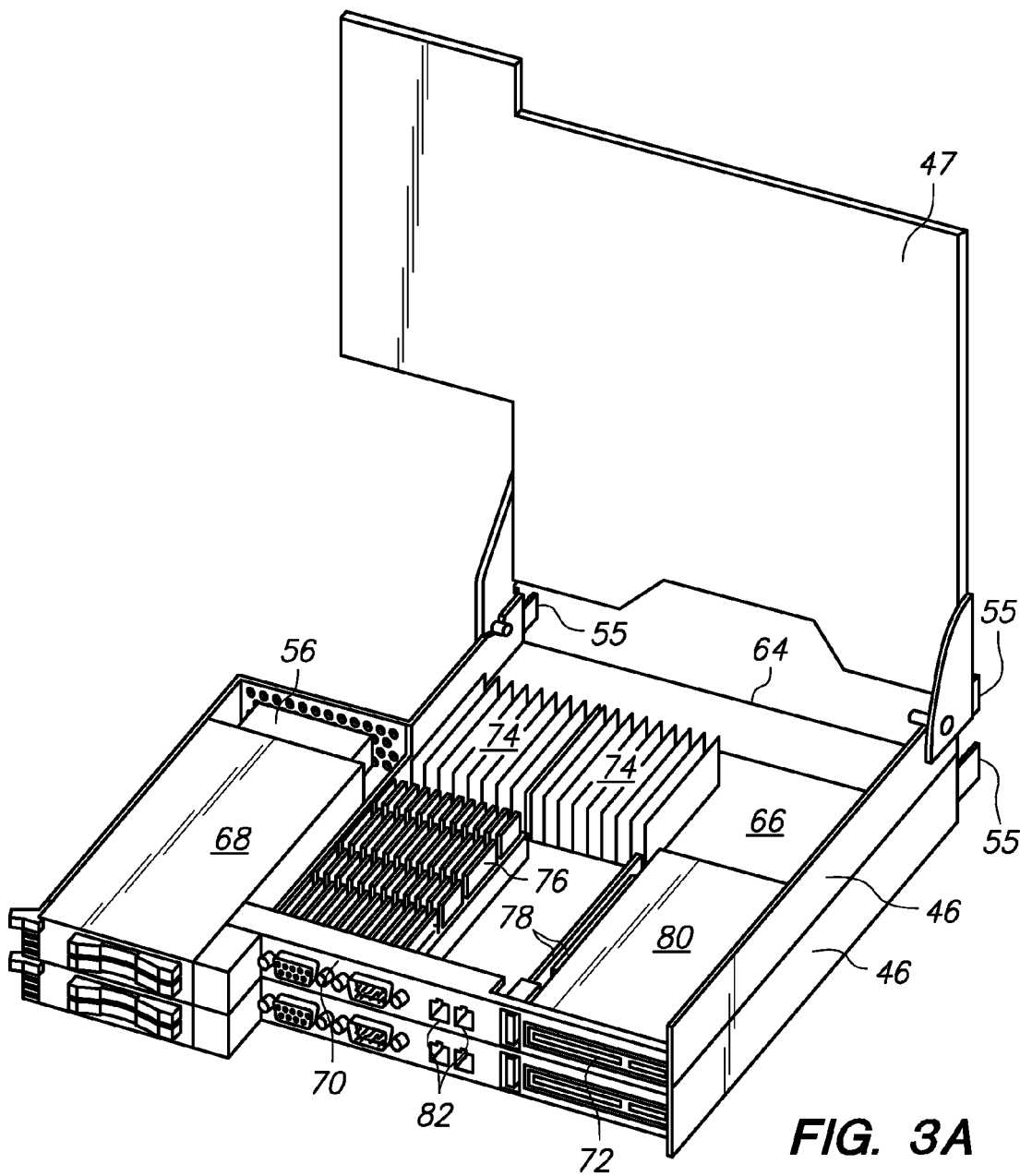
FIG. 3A is a perspective view of two compute modules, wherein the upper module has its top cover opened for illustration.

FIG. 3A is a perspective view of two compute modules 46, wherein the upper module has its top cover 47 opened for illustration. The module 46 includes a tray 64, a rearward facing power connector 56, a motherboard 66, and a hard disk drive 68. The motherboard 66 is preferably an industry standard motherboard, which may include a pair of processors 74, a plurality of memory modules 76, a riser card 78 and a PCI card 80. Other components that are necessary or beneficial to the operation of the motherboard 66 are not shown, but it should be understood that such other components will be present on a functioning motherboard. Cable connections from the rearward-facing power connector 56 to the motherboard 66 and the hard disk drive 68 are also provided.

Figure 3B:
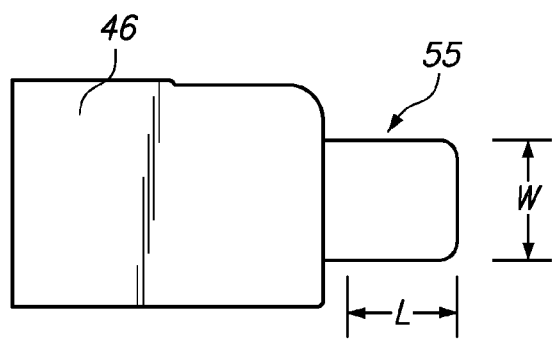
FIG. 3B is a side view of a damper actuator extending from a module.

FIG. 3B is a side view of a damper actuator 55 extending from a module 46. The damper actuators 55 preferably extend distally from parallel sides of the module 46. In this position, the actuators 55 do not interfere with air flow or cabling between modules and are easily inserted through slots in the grill. The damper actuators should be rigid in order to push open dampers as the module is received in a chassis. The damper actuators 55 of any given module 46 have a profile that determines how the actuator will engage and operate a damper. As shown in FIG. 3B, the profile of damper actuator 55 is substantially rectangular, as defined by a width W and a length L with rounded corners. However, the profile could also be arcuate or form part of a polygon. While the actuators 55 are preferably formed in generally parallel planes as defined by the sidewalls of the module 46, it should be recognized that the actuators may lie in other planes or be non-planar geometrical shapes.

Figure 4:
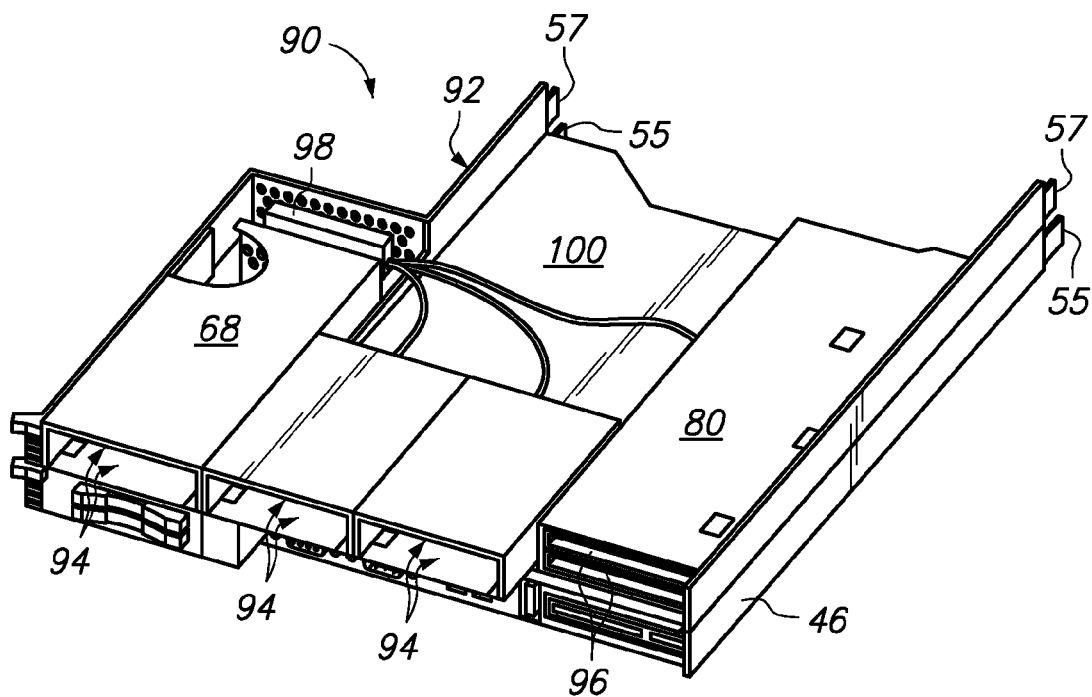
FIG. 4 is a perspective view of a compute module and an expansion module having different thermal loads.

FIG. 4 is a perspective view of a 2U computer subassembly 90 including a single compute module 46 and a first expansion module 92 secured above the compute module. The different configurations and components within these modules give them different thermal loads. An exemplary compute module 46 was described in relation to FIG. 3A. In FIG. 4, the first expansion module 92 has provides six small form factor hard disk drive bays 94 and two PCI slots 96. A rearward-facing power connector 98 is disposed on the expansion module tray 100 to directly blind dock with a power supply connector 54 (See FIG. 2) and provide power to each of the hard disk drive bays 94. One or more openings in the expansion module tray 100 allow one or more communication cable to extend between components installed in the expansion module 92 and the motherboard 66 in the compute module 46 that lies beneath the expansion module. Accordingly, it is preferably, but not absolutely necessarily, for the compute module and expansion module to be mechanically coupled to aid in their coordinated insertion into a chassis. Such mechanical coupling may include the use of any conventional fastener or fastening system, but is preferably simple and quick to couple and uncouple. For example, the mechanical coupling may be a simple set of tabs or hinge pins on one module that is aligned to be received in a slot in an adjacent module so that two modules will not slide relative to one another, but may be easily separated outside a chassis by lifting or rotating one module relative to the other. Both the expansion module 90 and the compute module 46 in FIG. 4 may then be installed in the same 2U chassis, such as the chassis 32 of FIG. 2.

Figure 5:
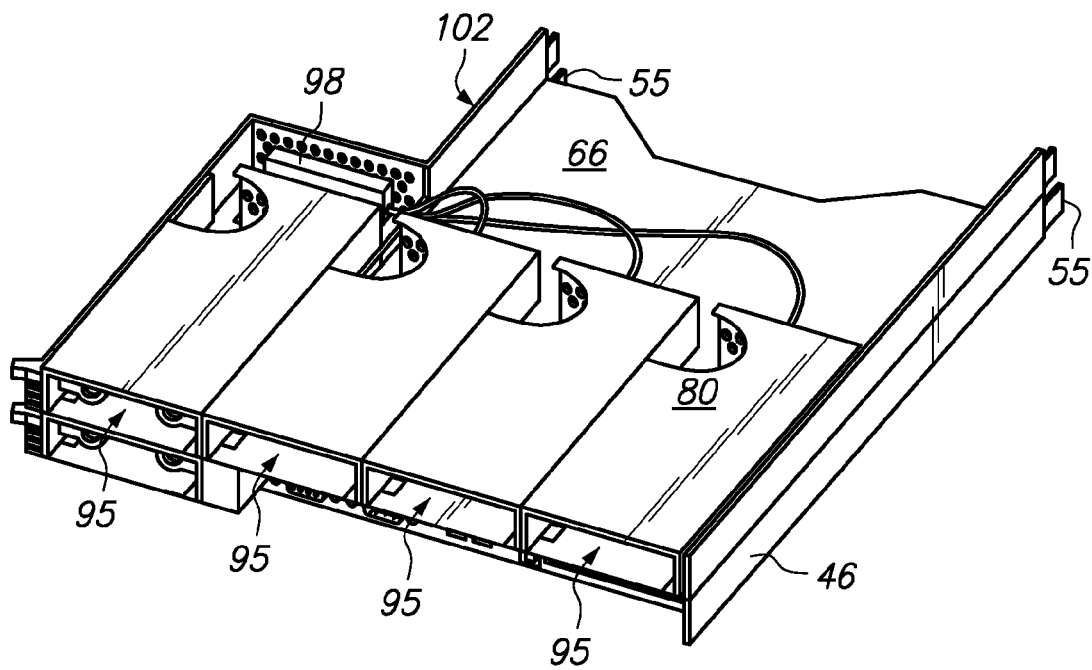
FIG. 5 is a perspective view of a compute module and a second expansion module having different thermal loads.

FIG. 5 is a perspective view of a 2U computer subassembly including a single compute module 46 and a second expansion module 102 secured to the compute module. The compute module 46, the expansion module 92, and the expansion module 102 of FIG. 4 each have different components resulting in different thermal loads. In particular, the second expansion module 102 includes four 3.5 inch hard disk drive bays 95 and no PCI slots.

Figure 6:
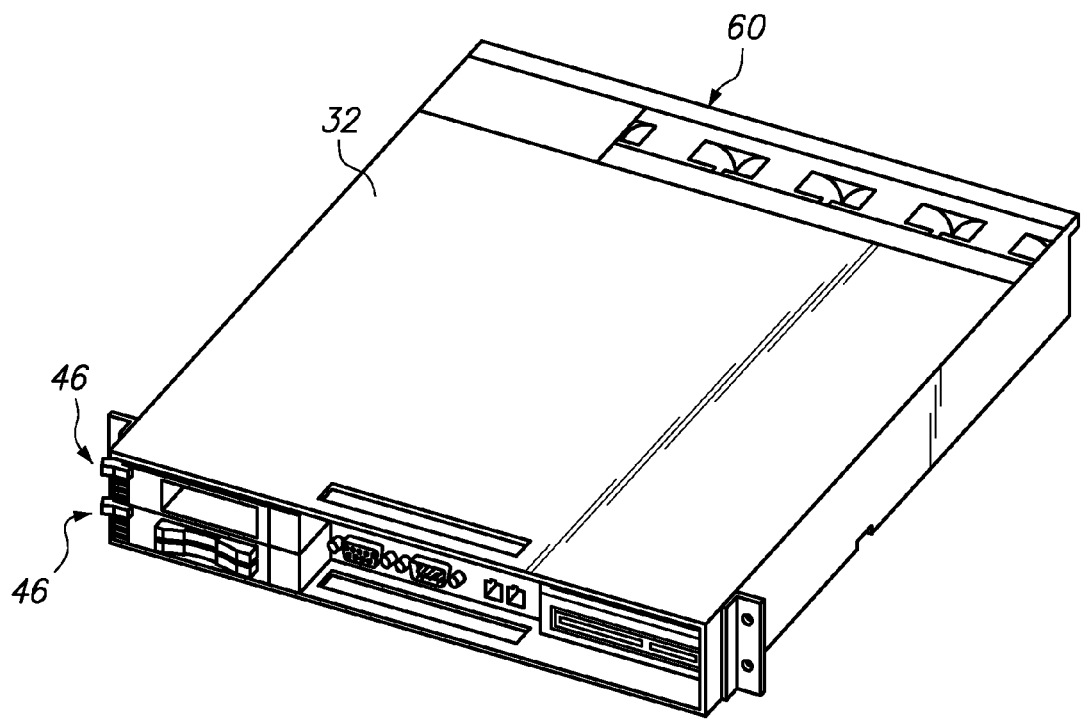
FIG. 6 is a perspective view of a 2U chassis having received two compute modules, wherein the top rear access cover has been removed to illustrate fan location.

FIG. 6 is a perspective view of a 2U chassis 32 having received two compute modules 46. At the distal end of the chassis 32, the fan assembly 60 is shown, wherein the chassis rear access cover has been removed for illustration.

Figure 7:
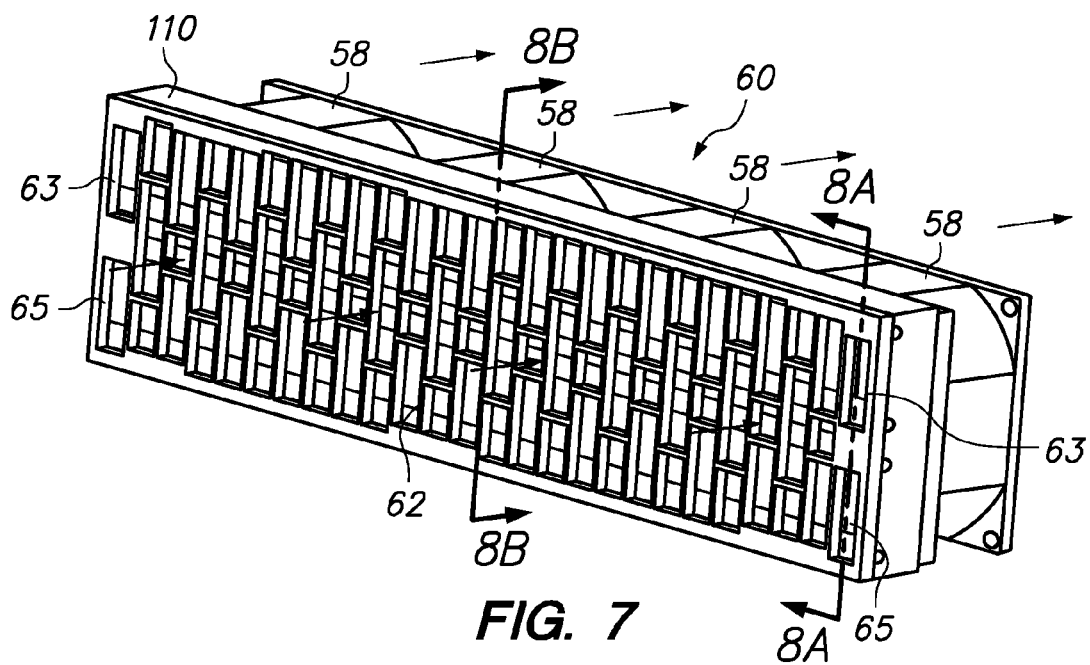
FIG. 7 is a perspective view of a fan assembly for use in the 2U chassis of FIG. 6.

FIG. 7 is a perspective view of the fan assembly 60 for use in the 2U chassis 32 of FIG. 6. The fan assembly 60 includes four fans 58 oriented to draw air through the protective intake grill 62 are exhaust air distally (as shown by the arrows). The protective grill 62 is secured to the fans 58 by a frame 110. The frame 110 pivotally secures individual damper blades 112 (shown in an open position) that provide a damper aligned with each bay of the chassis 32. Furthermore, the grill 62 includes two damper actuator slots 63 to align with the damper actuators of an upper module and two damper actuator slots 65 to align with the damper actuators of a lower module. Accordingly, the dampers are protected by the grill, but operable by damper actuators that extend into the slots.

Figure 8B:
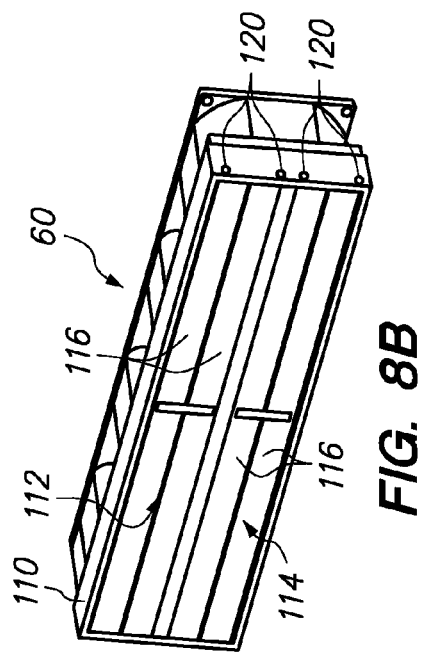
FIGS. 8A and 8B provide a cross-sectional side view and a perspective view of the fan assembly of FIG. 7, with the air flow dampers closed.
Figure 8A:
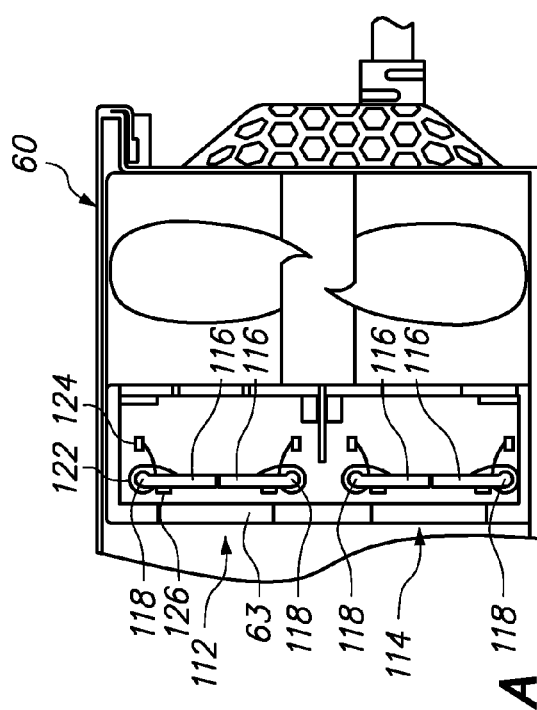

FIGS. 8A and 8B provide a cross-sectional side view (taken along the section line 8A) and a perspective view (taken along the section line 8B) of the fan assembly 60 of FIG. 7, with the air flow dampers closed. FIG. 8A is a shows a first damper 112 and a second damper 114 each including upper and lower damper blades 116 that pivot about an axle or pivot pin 118. Each pivot pin 118 is received within a mating hole or bearing 120 in the frame 110. Accordingly, a pivot pin 118 at each end of a damper blade 112 is pivotally secured. Furthermore, each damper blade may be further pivotally supported along the length of the damper blade.

A coil spring 122 is disposed about the pivot pin 118 and having a first end biased against a shoulder 124 and a second end biased against the damper blade, such that the damper blade is biased toward a closed position (as shown). Optionally, the frame or grill may further include a second shoulder or surface 126 to stop the damper blade in a vertical position when closed.

FIG. 8B is perspective view of the fan assembly 60 taken along the section line 8B in FIG. 7, so that the grill 62 has been removed to further illustrate the dampers 112, 114. As shown in FIG. 8B, both dampers 112, 114 are closed, because no damper actuator has made contact with the damper blades (See corresponding FIG. 8A).

Figure 9B:
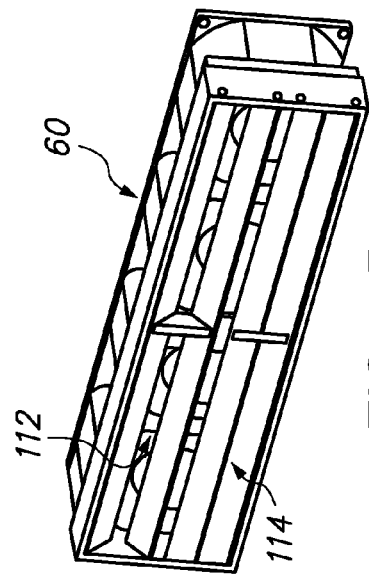
FIGS. 9A and 9B provide a cross-sectional side view and a perspective view of the fan assembly of FIG. 7, with the upper air flow damper partially opened and the lower air flow damper closed.
Figure 9A:
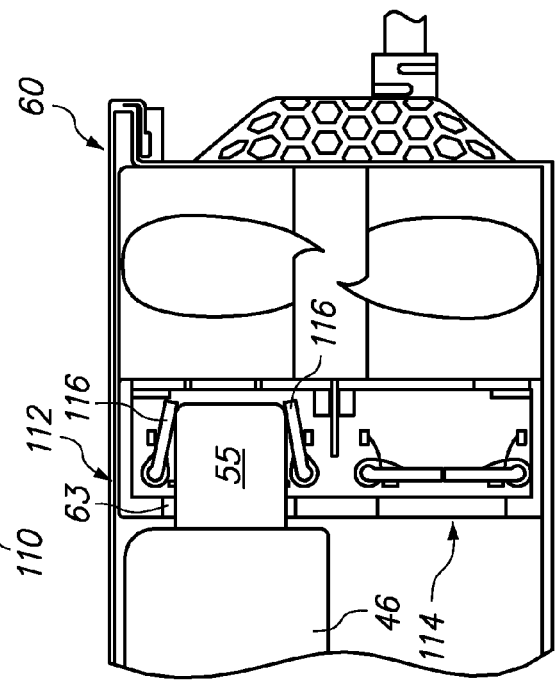

FIGS. 9A and 9B provide a cross-sectional side view and a perspective view of the fan assembly 60 of FIG. 7, with the upper air flow damper 112 partially opened and the lower air flow damper 114 closed. The upper air flow damper 112 is open because a compute module 46 has been received into the chassis bay, resulting in the damper actuator 55 extending through the slot 63 and into contact with the upper pair of damper blades 116. Accordingly, the air flow damper actuator 55 pushes the damper blades open against the biasing force of the springs to an extent directly related to the profile, such as the width and length, of the damper actuator. The damper blades will remain in this position until the damper actuator is removed from contact with the damper blades.

FIG. 9B is perspective view of the fan assembly 60 with the damper blades in a position corresponding to FIG. 9A. The upper damper 112 is now open and the lower damper 114 remains closed. As a result, air flow induced by operation of the fans will be directly primarily through the upper module 46, rather than allowing large volumes of air to bypass or short-circuit the upper module 46 and flow through the empty lower bay of the chassis.

FIGS. 10A and 10B provide a cross-sectional side view and a perspective view of the fan assembly 60 of FIG. 7, with both the upper air flow damper 112 and the lower air flow damper 114 open. The lower air flow damper 114 is opened in the same manner as the upper air flow damper 112 was opened as discussed in relation to FIG. 9A, because the lower bay has receiving a computer module 46. However, the upper air flow damper 112 is opened to a lesser extent, because it has received expansion module 92 (See FIG. 4). Because the expansion module 92 produces a lower thermal load, this module 92 has a damper actuator 57 with a smaller effective profile than damper actuator 55 (for example, a smaller width, smaller length, or both smaller width and length) so that the damper is opened to a lesser extent. It is apparent that these air flow dampers 112, 114 are independently operated (opened and closed) depending upon the presence of a module in the bay that is aligned with the damper. It should be recognized that still other modules, such as an expansion module 102, having a different damper actuator profile will open a corresponding damper to a greater or lesser extent in accordance with the thermal profile of that module.

FIG. 10C provides a cross-sectional side view of the fan assembly 60 of FIG. 10A, wherein each of the individual damper blades 116 include a ramp 117 contacting the damper actuator 55, 57 of the aligned module 46, 92. The ramp 117 does not affect the overall operation of a damper blade, but causes the damper blade 116 to move further out of the air flow pathway for any given damper actuator profile. Accordingly, the same damper actuators 55, 57, are used in FIGS. 10A and 10C, but the dampers 112, 114 in FIG. 10C have opened wider. This may be advantageous in order to allow the dampers to produce a minimum amount of air flow resistance when desired, such as when a compute module is installed.

The terms "comprising," "including," and "having," as used in the claims and specification herein, shall be considered as indicating an open group that may include other elements not specified. The terms "a," "an," and the singular forms of words shall be taken to include the plural form of the same words, such that the terms mean that one or more of something is provided. The term "one" or "single" may be used to indicate that one and only one of something is intended. Similarly, other specific integer values, such as "two," may be used when a specific number of things is intended. The terms "preferably," "preferred," "prefer," "optionally," "may," and similar terms are used to indicate that an item, condition or step being referred to is an optional (not required) feature of the invention.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. An apparatus comprising:
   a chassis having a proximal end that provides access to a plurality of module bays;
   one or more modules each received in one of the module bays, each module having at least one damper actuator distally extending from a distal end of the module;
   a fan assembly including a plurality of fans secured in a distal end of the chassis;
   a plurality of air flow dampers disposed between the module bays and the fan assembly, wherein each damper is aligned with one module bay to control air flow through the aligned module bay, wherein each damper closes in the absence of contact with one of the damper actuators and opens in response to contact with at least one of the damper actuators, and wherein the damper opens to a variable extent determined by the profile of the damper actuator contacting the damper as a result of one of the modules being received in one of the module bays.

2. The apparatus of claim 1, wherein the one or more modules includes first and second modules, wherein the first module has a damper actuator having a first profile aligned with a first damper and the second module has a damper actuator having a second profile aligned with a second damper.

3. The apparatus of claim 2, wherein the first module has a thermal load that is greater than a thermal load of the second module, and wherein the first damper actuator profile opens the first damper to a greater extent than the second damper actuator profile opens the second damper.

4. The apparatus of claim 3, wherein the air flow caused by the fan assembly is distributed between the first and second modules in proportion to the extent that the first and second dampers are open.

5. The apparatus of claim 1, wherein each damper is pivotally secured to a frame.

6. The apparatus of claim 5, further comprising:
   a protective grill disposed between the air flow dampers and the plurality of bays, wherein the protective grill is secured directly to the frame.

7. The apparatus of claim 1, wherein the air flow dampers are biased toward a closed position.

8. The apparatus of claim 1, further comprising:
   a protective grill disposed between the air flow dampers and the plurality of bays.

9. The apparatus of claim 8, wherein the protective grill includes passages to allow the damper actuators to engage the dampers.

10. The apparatus of claim 9, wherein the fan assembly, air flow dampers and protective grill are secured together in a unitary fan pack.

11. The apparatus of claim 1, wherein each module has two damper actuators.

12. The apparatus of claim 1, wherein each damper includes a ramp positioned for contact with one of the damper actuators.

13. The apparatus of claim 1, wherein the chassis includes exactly two module bays.

14. The apparatus of claim 1, wherein each air flow damper includes a pair of damper blades.

* * * * *